United States Patent
Tamada et al.

(10) Patent No.: US 10,418,347 B2
(45) Date of Patent: Sep. 17, 2019

(54) POWER SEMICONDUCTOR DEVICE AND POWER SEMICONDUCTOR CORE MODULE

(71) Applicant: Mitsubishi Electric Corporation, Tokyo (JP)

(72) Inventors: Yoshiko Tamada, Tokyo (JP); Yoshihiro Yamaguchi, Tokyo (JP); Seiji Oka, Tokyo (JP); Tetsuo Motomiya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/774,014

(22) PCT Filed: Mar. 3, 2016

(86) PCT No.: PCT/JP2016/056526
§ 371 (c)(1),
(2) Date: May 7, 2018

(87) PCT Pub. No.: WO2017/149714
PCT Pub. Date: Sep. 8, 2017

(65) Prior Publication Data
US 2018/0331077 A1    Nov. 15, 2018

(51) Int. Cl.
*H01L 23/16*        (2006.01)
*H01L 25/07*        (2006.01)
(Continued)

(52) U.S. Cl.
CPC ............ *H01L 25/072* (2013.01); *H01L 21/52* (2013.01); *H01L 23/051* (2013.01); *H01L 23/16* (2013.01);
(Continued)

(58) Field of Classification Search
CPC . H01L 25/072; H01L 23/16; H01L 23/49517; H01L 23/051; H01L 25/18;
(Continued)

(56) References Cited

U.S. PATENT DOCUMENTS 5,726,466 A    3/1998  Nishitani
6,281,569 B1 *  8/2001  Sugiyama ............... H01L 24/72
                                                    257/688
(Continued)

FOREIGN PATENT DOCUMENTS

JP    H08-162579 A    6/1996
JP    H09-064270 A    3/1997
(Continued)

OTHER PUBLICATIONS

International Search Report issued in PCT/JP2016/056526; dated May 17, 2016.
An Office Action; "Notification of Reasons for Refusal," issued by the Japanese Patent Office dated Jul. 10, 2018, which corresponds to Japanese Patent Application No. 2018-502953 and is related to U.S. Appl. No. 15/774,014; with English language translation.
International Preliminary Report on Patentability issued in corresponding International Application No. PCT/JP2016/056526; dated Sep. 13, 2018.
(Continued)

*Primary Examiner* — Kyoung Lee
(74) *Attorney, Agent, or Firm* — Studebaker & Brackett PC

(57) ABSTRACT

It is an object to provide a pressure-contact power semiconductor device and a power semiconductor core module which are capable of properly reducing their sizes. Each power semiconductor core module includes the following: a plurality of power semiconductor chips including a plurality of self-turn-off semiconductor elements and a plurality of diodes adjacent to each other in plan view; and a plurality of
(Continued)

first springs disposed between an upper metal plate and a conductive cover plate. The plurality of self-turn-off semiconductor elements of each power semiconductor core module are arranged along any one of an L-shaped line, a cross-shaped line, and a T-shaped line in plan view.

10 Claims, 4 Drawing Sheets

(51) Int. Cl.
  *H01L 21/52* (2006.01)
  *H01L 25/18* (2006.01)
  *H01L 23/051* (2006.01)
  *H01L 23/495* (2006.01)
  *H01L 23/24* (2006.01)
  *H01L 29/16* (2006.01)
  *H01L 29/20* (2006.01)
  *H01L 29/739* (2006.01)
  *H01L 29/861* (2006.01)

(52) U.S. Cl.
  CPC ........ *H01L 23/24* (2013.01); *H01L 23/49517* (2013.01); *H01L 25/07* (2013.01); *H01L 25/18* (2013.01); *H01L 29/1602* (2013.01); *H01L 29/1608* (2013.01); *H01L 29/2003* (2013.01); *H01L 29/7393* (2013.01); *H01L 29/861* (2013.01)

(58) Field of Classification Search
  CPC ..... H01L 21/52; H01L 25/07; H01L 29/2003; H01L 29/1608; H01L 29/861; H01L 29/1602; H01L 29/7393
  See application file for complete search history.

(56) References Cited

U.S. PATENT DOCUMENTS

| | | | |
|---|---|---|---|
| 6,320,268 B1* | 11/2001 | Lang | ........................ H01L 24/72 257/177 |
| 7,005,739 B2 | 2/2006 | Kaufmann et al. | |
| 2004/0207070 A1 | 10/2004 | Kaufmann et al. | |
| 2011/0075451 A1* | 3/2011 | Bayerer | .................. H01L 24/06 363/37 |

FOREIGN PATENT DOCUMENTS

| | | |
|---|---|---|
| JP | H09-139395 A | 5/1997 |
| JP | H11-097462 A | 4/1999 |
| JP | 2001-102520 A | 4/2001 |
| JP | 2004-528724 A | 9/2004 |
| JP | 2005-209784 A | 8/2005 |
| JP | 4280626 B2 | 6/2009 |

* cited by examiner

F I G . 1
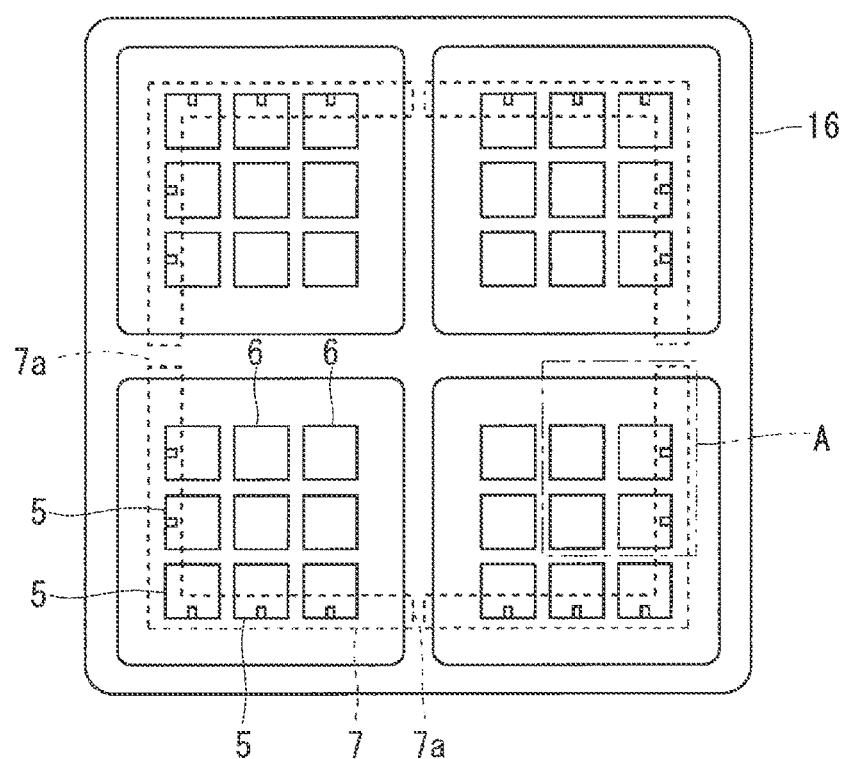

F I G. 6
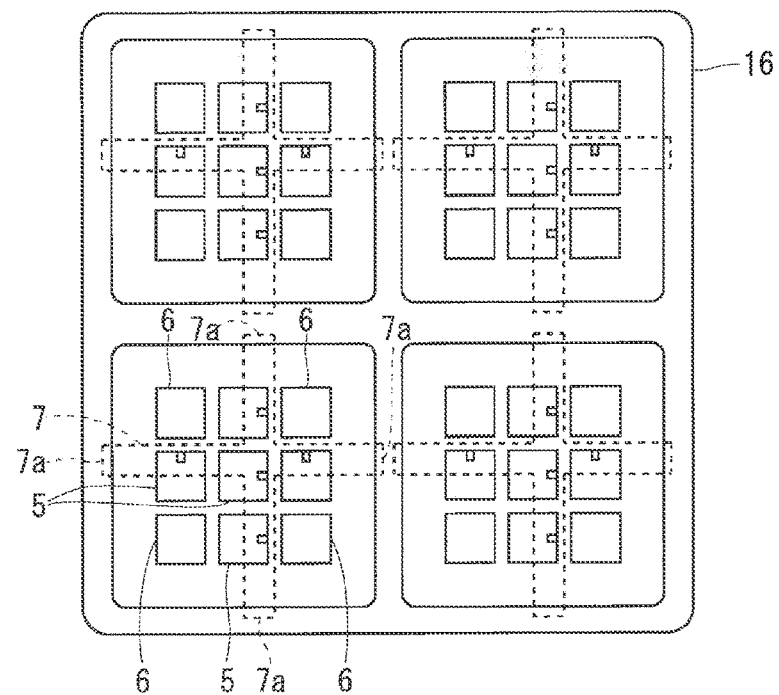
F I G. 7
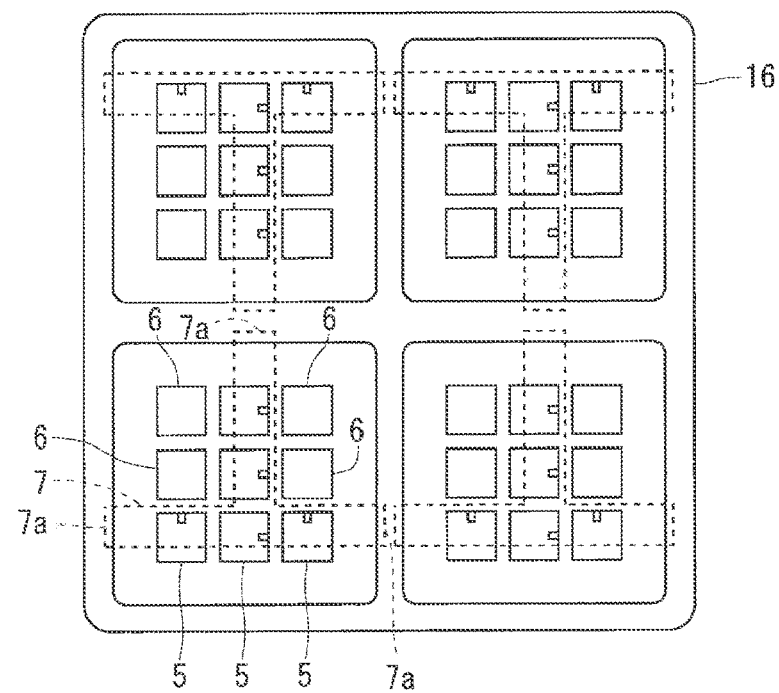

POWER SEMICONDUCTOR DEVICE AND POWER SEMICONDUCTOR CORE MODULE

TECHNICAL FIELD

The present invention relates to a pressure-contact power semiconductor device and a power semiconductor core module.

BACKGROUND ART

Various techniques have been recently proposed that relates to a pressure-contact power semiconductor device packaged through pressure contact, or to other types of semiconductor devices. Patent Document 1, for instance, discloses a pressure-contact high-output semiconductor module including a conductive base plate, a conductive cover plate, a plurality of stiff module housing components, and a plurality of semiconductor chips.

It is noted that each semiconductor chip has a lower surface connected to the base plate through a first electrode, and an upper surface connected to the cover plate through a second electrode and a plurality of flexible and compressible contact components (individual press pins that are members for electrical connection). It is also noted that the semiconductor chips and the contact components are induced by a submodule housing element made of a polyamide resin.

PRIOR ART DOCUMENT

Patent Document

Patent Document 1: Japanese Patent No. 4280626

SUMMARY

Problem to be Solved by the Invention

The high-output semiconductor module in Patent Document 1 is configured such that a plurality of pretested submodules are arranged within a single module housing component in parallel with each other. Then, a gate electrode of an integrated gate bipolar transistor (IGBT), which is a semiconductor chip, is connected to a gate runner disposed on the side of the semiconductor chip through wire bond contact, and thus is collected on a single, common gate signal conductor. The gate signal conductor is presumably capable of electrical communication with the outside through a common gate/auxiliary contact portion attached on a module cover.

In such a structure, a gate of a self-turn-off semiconductor element is connected to the gate runner disposed between the chips, through wire bond contact. Hence, the base plate has a large area in conformance with a wire on the gate runner. This is unsuitable for a small device. Accordingly, a spring electrical contact portion can be used instead of the gate runner. Unfortunately, the spring electrical contact portion, which is individually provided, is difficult to be positioned with respect to a conductor connected to the spring electrical contact portion in assembly. This degrades the reliability of the electrical joining between the spring electrical contact portion and the conductor.

The present invention has been made in view of this problem. It is an object of the present invention to provide a pressure-contact power semiconductor device and a power semiconductor core module which are capable of properly reducing their sizes.

Means to Solve the Problem

A power semiconductor device according to a first aspect of the present invention includes a plurality of power semiconductor core modules in which one conductive cover plate is disposed above one conductive base plate. Each power semiconductor core module includes the following: a plurality of power semiconductor chips including a plurality of self-turn-off semiconductor elements and a plurality of diodes adjacent to each other in plan view; an upper metal plate disposed between each self-turn-off semiconductor element or each diode, and the conductive cover plate; a lower metal plate disposed between each self-turn-off semiconductor element or each diode, and the conductive base plate; and a plurality of first springs disposed between the upper metal plate and the conductive cover plate. The plurality of self-turn-off semiconductor elements of each power semiconductor core module are arranged along any one of an L-shaped line, a cross-shaped line, and a T-shaped line in plan view.

In a power semiconductor core module according to a second aspect of the present invention, a conductive cover plate is disposed above a conductive base plate. The power semiconductor core module includes the following: a plurality of power semiconductor chips including a plurality of self-turn-off semiconductor element and a plurality of diodes adjacent to each other in plan view; an upper metal plate disposed between a part of each self-turn-off semiconductor element or each diode, and the conductive cover plate; a lower metal plate disposed between each self-turn-off semiconductor element or each diode, and the conductive base plate; a plurality of first springs disposed between the upper metal plate and the conductive cover plate; a signal substrate protruding downward from a portion of a lower part of the conductive cover plate, the portion being located above a remaining part other than the part of each self-turn-off semiconductor element; a second spring disposed between the remaining part of each self-turn-off semiconductor element and the signal substrate, and electrically connecting the remaining part and the single substrate together; and a frame individually surrounding the plurality of self-turn-off semiconductor elements and the plurality of diodes. An upper part of the frame has a hollow fitted in the signal substrate.

Effects of the Invention

According to the first aspect of the present invention, the plurality of self-turn-off semiconductor elements of each power semiconductor core module are arranged along any one of the L-shaped line, the cross-shaped line, and the T-shaped line in plan view. This enhances the heat dissipation capability of the self-turn-off semiconductor element and reduces the size of the device.

According to the second aspect of the present invention, the upper part of the frame has the hollow fitted in the signal substrate. Consequently, the hollow serves as a positioning guide, thereby reducing the size of the device while facilitating the positioning between the signal substrate and the second spring.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a schematic plan view of a configuration of part of a power semiconductor device according to a first embodiment.

FIG. 6 is a schematic plan view of a configuration of part of a power semiconductor device according to a third embodiment.

FIG. 7 is a schematic plan view of a configuration of part of a power semiconductor device according to a modification.

DESCRIPTION OF EMBODIMENT(S)

First Embodiment

FIG. 1 is a schematic plan view of a configuration of part of a power semiconductor device according to a first embodiment of the present invention. The power semiconductor device in FIG. 1 includes four, in total, (a plurality of) substantially quadrangular power semiconductor core modules arranged in two rows and two columns in longitudinal and transverse directions. It is noted that any number of power semiconductor core modules may be arranged, and two or more power semiconductor core modules are required to be arranged.

Figure 2:
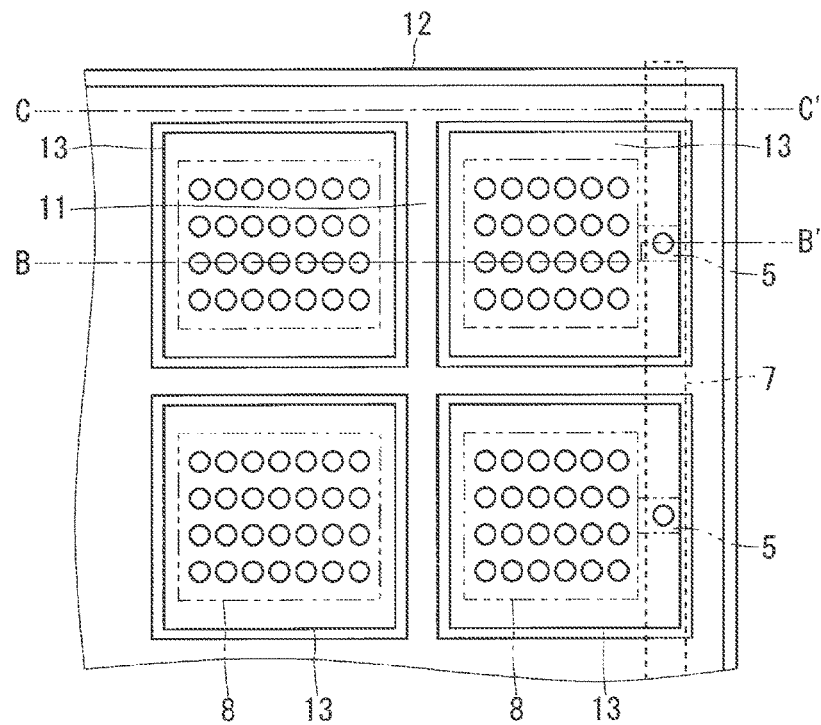
FIG. 2 is a schematic plan view of a configuration of a power semiconductor core module according to the first embodiment.
Figure 3:
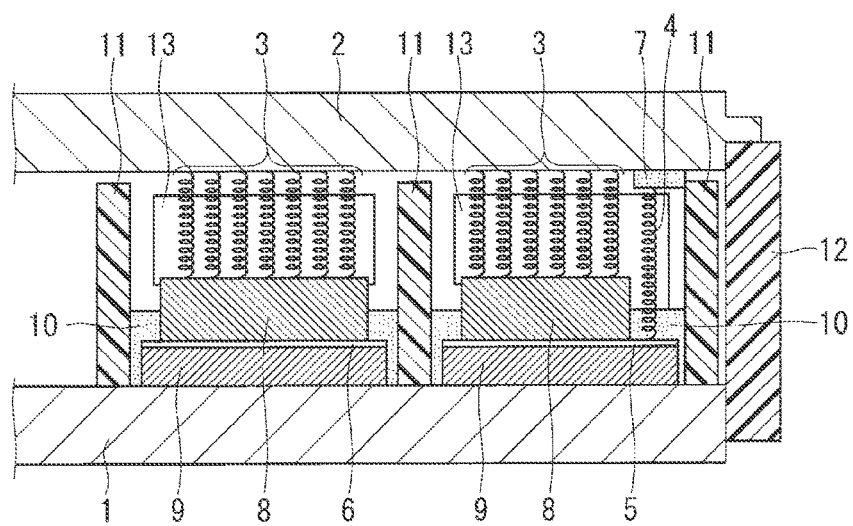
FIG. 3 is a schematic cross-sectional view of the configuration of the power semiconductor core module according to the first embodiment.
Figure 4:
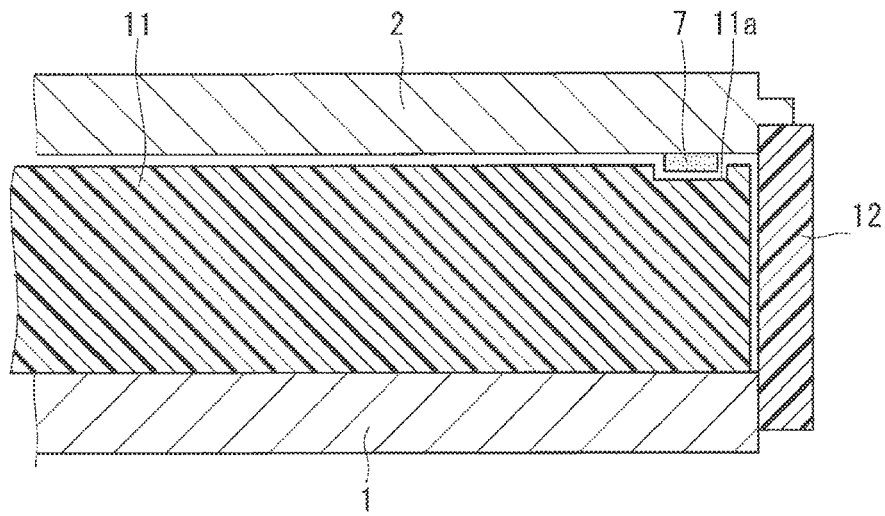
FIG. 4 is a schematic cross-sectional view of the configuration of the power semiconductor core module according to the first embodiment.

FIG. 2 is a schematic plan view of a power semiconductor core module according to the first embodiment, and is specifically an enlarged plan view of a region A in FIG. 1. FIGS. 3 and 4 are schematic cross-sectional views of the configuration of the power semiconductor core module. Specifically, FIG. 3 is a cross-sectional view taken along line B-B' in FIG. 2; in addition, FIG. 4 is a cross-sectional view taken along line C-C' in FIG. 2.

As illustrated in FIGS. 3 and 4, the power semiconductor core module includes a conductive base plate 1 and a conductive cover plate 2 disposed above the conductive base plate 1.

The power semiconductor core module includes the following: a plurality of power semiconductor chips including a plurality of self-turn-off semiconductor elements 5 and a plurality of diodes 6; upper metal plate plates, which in this embodiment are upper-chip metal plates 8; and lower metal plates, which in this embodiment are lower-chip metal plates 9.

The plurality of self-turn-off semiconductor elements 5 and the plurality of diodes 6 are adjacent to each other in plan view. In the example of FIG. 1, five self-turn-off semiconductor elements 5 and four diodes 6 are arranged in a matrix of 3×3. It is noted that chip layout is not limited to the matrix of 3×3.

It is also noted that examples of each self-turn-off semiconductor element 5 include a metal oxide semiconductor field effect transistor (MOSFET) and an insulated gate bipolar transistor (IGBT). It is also noted that examples of each diode 6 include a Schottky barrier diode (SBD) and a PN diode.

The upper-chip metal plates 8 are each disposed between part of the self-turn-off semiconductor element 5 or the diode 6, and the conductive cover plate 2. It is noted that a single upper-chip metal plate 8 is disposed on a single self-turn-off semiconductor element 5 in the first embodiment.

The lower-chip metal plates 9 are each disposed between the self-turn-off semiconductor element 5 or the diode 6, and the conductive base plate 1. It is noted that a single lower-chip metal plate 9 is disposed on a single diode 6 in the first embodiment.

In addition to these components, the power semiconductor core module includes a plurality of pressure-contact wire springs 3 (first springs), signal wire springs 4 (second springs), a signal substrate 7, and spring supports 13 having insulation properties.

The spring supports 13 and the plurality of pressure-contact wire springs 3 are each disposed between the upper-chip metal plate 8 and the conductive cover plate 2. The spring support 13 has a plurality of cylindrical holes on the upper-chip metal plate 8. The plurality of pressure-contact wire springs 3 are inserted to the plurality of cylindrical holes. Moreover, the plurality of pressure-contact wire springs 3 are in contact with the upper-chip metal plate 8 and the conductive cover plate 2 while extending in an up-and-down direction.

The spring support 13 and the signal wire spring 4 are disposed between the signal substrate 7 and an exposed portion of the self-turn-off semiconductor element 5, the exposed portion being exposed from the upper-chip metal plate 8 (i.e., the exposed portion is the remaining part other than the part of the self-turn-off semiconductor element 5). The spring support 13 has a cylindrical hole on the exposed portion of the self-turn-off semiconductor element 5. The signal wire spring 4 is inserted to the cylindrical hole. Moreover, the signal wire spring 4 is in contact with the exposed portion of the self-turn-off semiconductor element 5 and the signal substrate 7 while extending in an up-and-down direction. Accordingly, the signal wire spring 4 has two ends: one is electrically connected to a signal pad of a gate or an emitter disposed in the exposed portion of the self-turn-off semiconductor element 5; and the other is electrically connected to the signal substrate 7 of the gate or the emitter.

Examples of each pressure-contact wire spring 3 and each signal wire spring 4 include a coil spring and a ring spring. It is noted that the signal pads of both gate and emitter of the self-turn-off semiconductor element 5 can be electrically connected to the signal substrates 7 of both gate and emitter. Accordingly, a plurality of signal wire springs 4 may be provided.

As illustrated in FIGS. 3 and 4, the signal substrate 7 protrudes downward from a portion of the lower part of the conductive cover plate 2, the portion being located above the exposed portion of each self-turn-off semiconductor element 5. Further, the signal substrate 7 is provided for each power semiconductor core module, and has an L-shape in plan view, as illustrated in FIGS. 1 and 2. The signal substrate 7 is insulated from the conductive cover plate 2, and is capable of being energized in a direction in which the signal substrate 7 extends. In the example of FIG. 1, the signal substrate 7 is electrically connected to five self-turn-off semiconductor elements 5 in a collective manner. Such a configuration establishes a collective connection between signal wires above the self-turn-off semiconductor element 5, thereby achieving a small power semiconductor device.

The power semiconductor core module is packaged while being pressed from above and below, i.e., from the conductive base plate 1 and the conductive cover plate 2. The pressure-contact wire spring 3 and the signal wire spring 4 are thus compressed, thereby producing a restoring force in response to the compression. The restoring force of the signal wire spring 4 makes the signal wire spring 4 be in contact with the self-turn-off semiconductor element 5 and the signal substrate 7. This enhances the reliability of the electrical connection (joining) between the self-turn-off semiconductor element 5 and the signal substrate 7, and by extension, enhances the operational reliability of the chip. It is noted that in a manner similar to the signal wire spring 4, an electrical connection (joining) may be established with respect to the pressure-contact wire spring 3, thereby electrically connecting the diode 6 and another component together; alternatively, the diode 6 may be electrically connected to the other component through wire bond (not shown).

In addition to these components, the power semiconductor core module includes a sealing resin 10 and a frame (an inner resin frame 11 and an outer resin frame 12).

The inner resin frame 11 is fixed to the conductive base plate 1 while individually surrounding the plurality of self-turn-off semiconductor elements 5 and the plurality of diodes 6. That is, the inner resin frame 11 separates the plurality of power semiconductor chips (the plurality of self-turn-off semiconductor elements 5 and the plurality of diodes 6) from each other.

The outer resin frame 12 is fixed to the conductive cover plate 2 while surrounding the inner resin frame 11. The sealing resin 10 is filled inside a container formed by the conductive base plate 1 and the inner resin frame 11 so as to reach a given height.

As illustrated in FIG. 4, disposed in the upper part of the inner resin frame 11 is a hollow, which in this embodiment is a cutout 11a. In addition, disposed in the upper part of the outer resin frame 12 is a hollow or a cutout (not shown). Moreover, the signal substrate 7 is fitted in the cutout 11a of the inner resin frame 11 and the cutout of the outer resin frame 12. By virtue of such a configuration, the cutouts serve as positioning guides. This facilitates the positioning of the signal substrate 7 and the self-turn-off semiconductor element 5 with respect to the signal wire spring 4. In addition, this configuration establishes a proper, electrical contact, thereby enhancing the reliability of the electrical connection (joining).

It is noted that the inner resin frame 11 serves as a stopper preventing the distance between the conductive base plate 1 and the conductive cover plate 2 from being shorter than a certain value in the pressure application from above and below, i.e., from these plates. Hence, a height adjustment of the inner resin frame 11 enables the pressure-contact wire spring 3 and the signal wire spring 4 to produce proper restoring forces (pressures). In addition, a uniform height of the inner resin frame 11 enables the distance between the conductive base plate 1 and the conductive cover plate 2 to be kept uniform. This enables the plurality of pressure-contact wire springs 3 to exert a uniform, down force (pressure) on the plurality of power semiconductor chips disposed in the inside, and by extension, on the upper-chip metal plates 8 disposed on the power semiconductor chips, thereby enhancing connection reliability.

Referring back to FIG. 1, the plurality self-turn-off semiconductor elements 5 of each power semiconductor core module are arranged along an L-shaped line (the L-shaped signal substrate 7) in plan view in the first embodiment. The diodes 6 are thus arranged in the center of the power semiconductor in FIG. 1; in addition, the self-turn-off semiconductor elements 5, and by extension, the signal wire springs 4 are arranged in the outer periphery of the power semiconductor in FIG. 1.

The signal substrate 7 has two ends 7a exposed from the cutouts of side surfaces of the power semiconductor core module (the outer resin frame 12) to the outside of the power semiconductor core module. Moreover, although not shown, the exposed ends 7a of the signal substrates 7 of the adjacent power semiconductor core modules are electrically connected to each other. The connection can be an electrical connection through, for instance, a cable. Various types of connection are applicable that include a connection with a connector, a solder connection, and a screw connection.

Here, one power semiconductor core module turned in plan view coincides with the other power semiconductor core modules. For instance, when the position of the L-shape of one power semiconductor core module in FIG. 1 is turned by every 90 degrees, the one power semiconductor core module coincides with the three other power semiconductor core modules. Such a configuration, which enables power semiconductor core modules of a single kind to constitute the power semiconductor device, enhances productivity and achieves cost reduction.

As illustrated in FIG. 1, the conductive base plate 1, the conductive cover plate 2, and the plurality of (four in FIG. 1) power semiconductor core modules including the aforementioned components sandwiched between these plates, are disposed on a common collector metal plate 16. Moreover, the signal substrates 7 (a gate signal substrate and an emitter signal substrate) of the individual power semiconductor core modules are exposed from the side surfaces of the power semiconductor core modules. Moreover, the ends of the signal substrates 7 are electrically connected to each other. Here, the emitter signal substrates whose ends are electrically connected to each other are electrically connected to a common emitter metal plate (not shown). The common emitter metal plate (not shown) is pressure-welded to each power semiconductor core module, in a location opposite the common collector metal plate 16. As such, the power semiconductor device according to the first embodiment has an integrated configuration including the plurality of power semiconductor core modules, the common collector metal plate 16, and the common emitter metal plate (not shown).

The power semiconductor device in the first embodiment is configured such that the plurality of self-turn-off semiconductor elements 5 of each power semiconductor core module are arranged along the L-shaped line in plan view. The diodes 6 are thus arranged in the center of the power semiconductor; in addition, the self-turn-off semiconductor elements 5 are arranged in the outer periphery of the power semiconductor. This enhances the heat dissipation capability of the self-turn-off semiconductor element 5. As a result, the self-turn-off semiconductor element 5 can be formed of an element having large heat generation.

In the first embodiment, the cutout, in which the signal substrate 7 is fitted, is disposed above the frame (the inner resin frame 11 and the outer resin frame 12). Consequently, the cutout serves as a positioning guide. This facilitates the positioning of the signal substrate 7 and the self-turn-off semiconductor element 5 with respect to the signal wire spring 4. In addition, this configuration establishes a proper, electrical contact, thereby enhancing the reliability of the electrical connection (joining).

In the first embodiment, the signal substrate 7 is exposed from the cutout to the outside of the power semiconductor core module. This establishes an electrical connection between the exposed portions of the signal substrates 7 of the adjacent power semiconductor core modules. Accordingly, a number adjustment of the power semiconductor core modules to be connected in parallel to each other achieves a power semiconductor device having a desired current capacity. Moreover, the cost reduction and easy assembly are achieved.

In the first embodiment, the signal substrate 7 has an L-shape in plan view. This improves the yield rate of substrate, thereby achieving the cost reduction. It is noted that the signal substrate 7 can be formed of a printed substrate consisting of two or more layers or a metal-laminated substrate with an insulating layer interposed between metals. Thus, wiring is achieved by the use of a narrow signal substrate 7. This achieves a smaller power semiconductor device, and enables a gate circuit and an emitter circuit to have a small loop, thereby preventing an abnormal operation due to electromagnetic induction and noise.

It is noted that at least one of the self-turn-off semiconductor element 5 and the diode 6 may be made of silicon or formed of a wide bandgap semiconductor (made of any one of silicon carbide, gallium nitride, and diamond). Such a configuration achieves a stable operation of the power semiconductor device under high temperature, and a rapid SW speed of the power semiconductor device.

Second Embodiment

Figure 5:
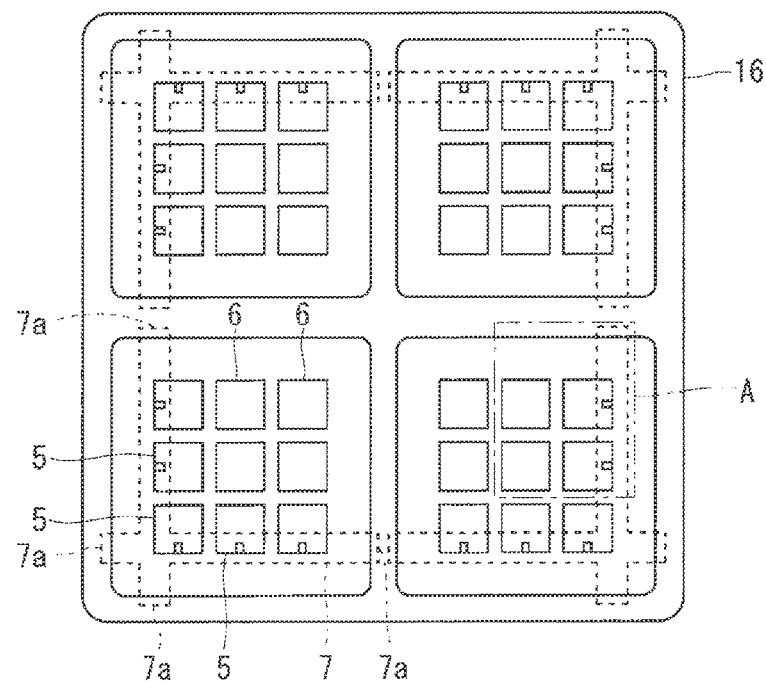
FIG. 5 is a schematic plan view of a configuration of part of a power semiconductor device according to a second embodiment.

FIG. 5 is a schematic plan view of a configuration of part of a power semiconductor device according to a second embodiment of the present invention. It is noted that identical or similar components between the power semiconductor device in the first embodiment and the power semiconductor device in the second embodiment are denoted by the same reference symbols, and that mainly described herein are different components between these power semiconductor devices.

In the second embodiment, the plurality of power semiconductor chips (the plurality of self-turn-off semiconductor elements 5 and the plurality of diodes 6) are arranged along an L-shaped line in plan view in the same manner as those in the first embodiment. Unlike the signal substrate 7 in the first embodiment, the signal substrate 7 of the power semiconductor core module has a cross shape in the second embodiment. In this way, the shape of the arrangement of the plurality of power semiconductor chips may disagree with the shape of the signal substrate 7.

In the first embodiment, the power semiconductor device includes four power semiconductor core modules connected to each other. For a power semiconductor device including five or more power semiconductor core modules connected to each other, the signal substrate 7 in the first embodiment, which has such a simple L-shape, produces a non-uniform distance between the adjacent signal substrates 7. This results in a signal delay between the signal substrates 7 to thus cause a non-uniform operation. The non-uniform operation unfavorably affects the self-turn-off semiconductor elements 5.

The signal substrate 7 in the second embodiment accordingly has not an L-shape, but a cross shape. Moreover, the signal substrate 7 has four ends 7a exposed to the outside of the power semiconductor core module. That is, the ends 7a of the signal substrate 7 are exposed in the respective four side surfaces of the power semiconductor core module. Such a configuration simply establishes electrical connections between the ends 7a of the adjacent signal substrates 7, thereby facilitating the assembly of the power semiconductor device. In addition, this configuration achieves a uniform distance between the adjacent signal substrates 7 in a power semiconductor device including two or more power semiconductor core modules, thereby reducing an unfavorable effect on the self-turn-off semiconductor elements 5.

In the first embodiment, the plurality of power semiconductor core modules are formed by turning the power semiconductor core module of a single kind by every 90 degrees for arrangement. In the second embodiment, without such turns, an identically oriented arrangement of the power semiconductor core module of a single kind can form a plurality of power semiconductor core modules. This reduces errors in the arrangement, thereby enhancing work efficiency. It is noted that the power semiconductor device, although including four power semiconductor core modules in the example of FIG. 5, may include any number of power semiconductor core modules; however, the power semiconductor device is required to include two or more power semiconductor core modules.

Third Embodiment

FIG. 6 is a schematic plan view of a configuration of part of a power semiconductor device according to a third embodiment of the present invention. It is noted that identical or similar components between the power semiconductor device in the second embodiment and the power semiconductor device in the third embodiment are denoted by the same reference symbols, and that mainly described herein are different components between these power semiconductor devices.

In the first and second embodiments, the plurality of power semiconductor chips (the plurality of self-turn-off semiconductor elements 5 and the plurality of diodes 6) are arranged along an L-shaped line in plan view. Here, in the first embodiment, the power semiconductor core module of a single kind is turned by every 90 degrees for arrangement to disperse generated heat and enhance the heat dissipation capability. In the second embodiment, the power semiconductor core modules of a single kind, which are arranged so as to be parallel displacement with each other, produces variations in heat generation. As a result, a user faces difficulty in thermal design. This can unfavorably affect the quality of the power semiconductor device.

To address this problem, the power semiconductor device in the third embodiment is configured to improve the variations in heat generation. To be specific, the plurality of power semiconductor chips (the plurality of self-turn-off semiconductor elements 5 and the plurality of diodes 6) in the third embodiment are arranged along a cross-shaped line in plan view as illustrated in FIG. 6. This achieves a homogeneous distribution of heat generation with respect to the power semiconductor core modules. Thus, the variations in heat generation are prevented in the power semiconductor device. This facilitates the thermal design, thereby preventing the unfavorable effect on the quality. In addition, the plurality of self-turn-off semiconductor elements 5 are not locally gathered, but are substantially arranged to form lines in plan view when the power semiconductor core modules are arranged. As a result, generated heat of the plurality of self-turn-off semiconductor elements 5 is conducted to relatively-low-temperature portions of the diodes 6. Hence, the heat dissipation capability is not affected. Moreover, in a manner similar to the signal substrate 7 in the second embodiment, the signal substrate 7 in the third embodiment, which has a cross shape, facilitates the assembly of the power semiconductor device and achieves a uniform distance between the adjacent signal substrates 7.

<Modification>

The aforementioned embodiments describe that the plurality of self-turn-off semiconductor elements 5 of each power semiconductor core module are arranged along an L-shaped line or a cross-shaped line in plan view. The plurality of self-turn-off semiconductor elements 5 may be arranged along a line having any shape; for instance, the self-turn-off semiconductor elements 5 of each power semiconductor core module may be arranged along a T-shaped line in plan view as illustrated in FIG. 7.

The aforementioned embodiments describes that the signal substrate 7 has an L shape or a cross shape in plan view. The signal substrate 7 may have any shape; for instance, the signal substrate 7 may have a T-shape, and three ends 7a of T-shape may be exposed to the outside of the power semiconductor core module.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 conductive base plate, 2 conductive cover plate, 3 pressure-contact wire spring, 4 signal wire spring, 5 self-turn-off semiconductor element, 6 diode, 7 signal substrate, 8 upper-chip metal plate, 9 lower-chip metal plate, 11 inner resin frame, 11a cutout, and 12 outer resin frame.

The invention claimed is:

1. A power semiconductor device comprising a plurality of power semiconductor core modules in which one conductive cover plate is disposed above one conductive base plate, wherein
    each power semiconductor core module comprises
        a plurality of power semiconductor chips comprising a plurality of self-turn-off semiconductor elements and a plurality of diodes adjacent to each other in plan view,
        an upper metal plate disposed between each self-turn-off semiconductor element or each diode, and the conductive cover plate,
        a lower metal plate disposed between each self-turn-off semiconductor element or each diode, and the conductive base plate, and
        a plurality of first springs disposed between the upper metal plate and the conductive cover plate, and
    the plurality of self-turn-off semiconductor elements of each power semiconductor core module are arranged along a signal substrate that protrudes from the conductive cover plate to form any one of an L-shaped line, a cross-shaped line, and a T-shaped line in plan view.

2. The power semiconductor device according to claim 1, wherein
    at least one of the self-turn-off semiconductor element and the diode is made of any one of silicon carbide, gallium nitride, and diamond.

3. The power semiconductor device according to claim 1, wherein
    said signal substrate protrudes downward from a portion of a lower part of the conductive cover plate, the portion being located above a remaining part other than the part of each self-turn-off semiconductor element, the signal substrate being any one of an L-shaped line, a cross-shaped line, and a T-shaped line in plan view.

4. A power semiconductor device comprising a plurality of power semiconductor core modules in which one conductive cover plate is disposed above one conductive base plate, wherein
    each power semiconductor core module comprises
        a plurality of power semiconductor chips comprising a plurality of self-turn-off semiconductor elements and a plurality of diodes adjacent to each other in plan view,
        an upper metal plate disposed between each self-turn-off semiconductor element or each diode, and the conductive cover plate,
        a lower metal plate disposed between each self-turn-off semiconductor element or each diode, and the conductive base plate, and
        a plurality of first springs disposed between the upper metal plate and the conductive cover plate,
    the plurality of self-turn-off semiconductor elements of each power semiconductor core module are arranged along any one of an L-shaped line, a cross-shaped line, and a T-shaped line in plan view,
    the upper metal plate is disposed between a part of each self-turn-off semiconductor element or each diode, and the conductive cover plate,
    each power semiconductor core module further comprises
        a signal substrate protruding downward from a portion of a lower part of the conductive cover plate, the portion being located above a remaining part other than the part of each self-turn-off semiconductor element,
        a second spring disposed between the remaining part of each self-turn-off semiconductor element and the signal substrate, and electrically connecting the remaining part and the single substrate together, and
        a frame individually surrounding the plurality of self-turn-off semiconductor elements and the plurality of diodes, and
    an upper part of the frame of each power semiconductor core module comprises a hollow fitted in the signal substrate.

5. The power semiconductor device according to claim 4, wherein
    the signal substrate of the power semiconductor core module is exposed from the hollow to an outside of the power semiconductor core module, and
    wherein exposed portions of the signal substrates of the power semiconductor core modules adjacent to each other are electrically connected to each other.

6. The power semiconductor device according to claim 4, wherein
    the signal substrate has an L-shape in plan view, and two ends of L-shape are exposed to an outside of the power semiconductor core module.

7. The power semiconductor device according to claim 4, wherein
    the signal substrate has a cross shape in plan view, and four ends of cross shape are exposed to an outside of the power semiconductor core module.

8. A power semiconductor core module in which a conductive cover plate is disposed above a conductive base plate, the power semiconductor core module comprising:

a plurality of power semiconductor chips comprising a plurality of self-turn-off semiconductor elements and a plurality of diodes adjacent to each other in plan view;

an upper metal plate disposed between a part of each self-turn-off semiconductor element or each diode, and the conductive cover plate;

a lower metal plate disposed between each self-turn-off semiconductor element or each diode, and the conductive base plate;

a plurality of first springs disposed between the upper metal plate and the conductive cover plate;

a signal substrate protruding downward from a portion of a lower part of the conductive cover plate, the portion being located above a remaining part other than the part of each self-turn-off semiconductor element;

a second spring disposed between the remaining part of each self-turn-off semiconductor element and the signal substrate, and electrically connecting the remaining part and the single substrate together; and a frame individually surrounding the plurality of self-turn-off semiconductor elements and the plurality of diodes, wherein an upper part of the frame comprises a hollow fitted in the signal substrate.

9. The power semiconductor core module according to claim 8, wherein the signal substrate is exposed from the hollow to an outside of the power semiconductor core module.

10. The power semiconductor core module according to claim 8, wherein at least one of the self-turn-off semiconductor element and the diode is made of any one of silicon carbide, gallium nitride, and diamond.

* * * * *